(12) United States Patent
Mizoguchi et al.

(10) Patent No.: US 8,017,901 B2
(45) Date of Patent: Sep. 13, 2011

(54) PHOTODETECTOR

(75) Inventors: Masaki Mizoguchi, Hamamatsu (JP);
Yasuhiro Suzuki, Hamamatsu (JP);
Seiichiro Mizuno, Hamamatsu (JP);
Hiroo Yamamoto, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 333 days.

(21) Appl. No.: 12/440,178

(22) PCT Filed: Sep. 5, 2007

(86) PCT No.: PCT/JP2007/067297
§ 371 (c)(1),
(2), (4) Date: Apr. 14, 2009

(87) PCT Pub. No.: WO2008/029840
PCT Pub. Date: Mar. 13, 2008

(65) Prior Publication Data
US 2010/0108862 A1    May 6, 2010

(30) Foreign Application Priority Data
Sep. 6, 2006    (JP) .................................. 2006-241797

(51) Int. Cl.
*H01J 40/14* (2006.01)
(52) U.S. Cl. .......... 250/214 R; 250/214 A; 250/214 LS; 327/337; 327/514
(58) Field of Classification Search .............. 250/214 R, 250/214 A, 214 LA, 214 LS, 214 C, 214 DC; 327/336, 337, 514; 356/215, 218
See application file for complete search history.

(56) References Cited

U.S. PATENT DOCUMENTS 6,172,353 B1 * 1/2001 Jensen ...................... 250/214 R
2009/0273386 A1 * 11/2009 Korobeynikov et al. ..... 327/337

FOREIGN PATENT DOCUMENTS

| JP | 59-229973 | 12/1984 |
| JP | 2001-141562 | 5/2001 |
| JP | 2001-235794 | 8/2001 |
| JP | 2006-129221 | 5/2006 |
| JP | 2006-332796 | 12/2006 |
| WO | 2005/108938 | 11/2005 |

OTHER PUBLICATIONS

Texas Instruments Inc., ADS8482 data sheet, Fig. 8, Jul. 2005, cover sheet and pp. 5-9 and 11-20.

* cited by examiner

*Primary Examiner* — Kevin Pyo
(74) *Attorney, Agent, or Firm* — Drinker Biddle & Reath LLP

(57) ABSTRACT

A photodetecting device 1 includes a photodiode $PD_{m,n}$, a switch $SW_{m,n}$ for the photodiode, an integrating circuit $12_m$, and a noise removing circuit $13_m$. The integrating circuit $12_m$ accumulates in a capacitor $C_{fk}$ an electric charge input from the photodiode $PD_{m,n}$ through the switch $SW_{m,n}$ for the photodiode, and outputs a voltage value according to the amount of the accumulated electric charge. The noise removing circuit $13_m$ includes an amplifier $A_3$, five switches $SW_{31}$ to $SW_{35}$, four capacitors $C_{31}$ to $C_{34}$, and a power supply $V_3$. The noise removing circuit $13_m$ takes in a voltage value that is output from the integrating circuit $12_m$ at a time where the switch $SW_{31}$ is first turned from a closed state to an open state, and after the time, outputs a voltage value according to a difference between the voltage value that is output from the integrating circuit $12_m$ and the voltage value previously taken in.

8 Claims, 10 Drawing Sheets

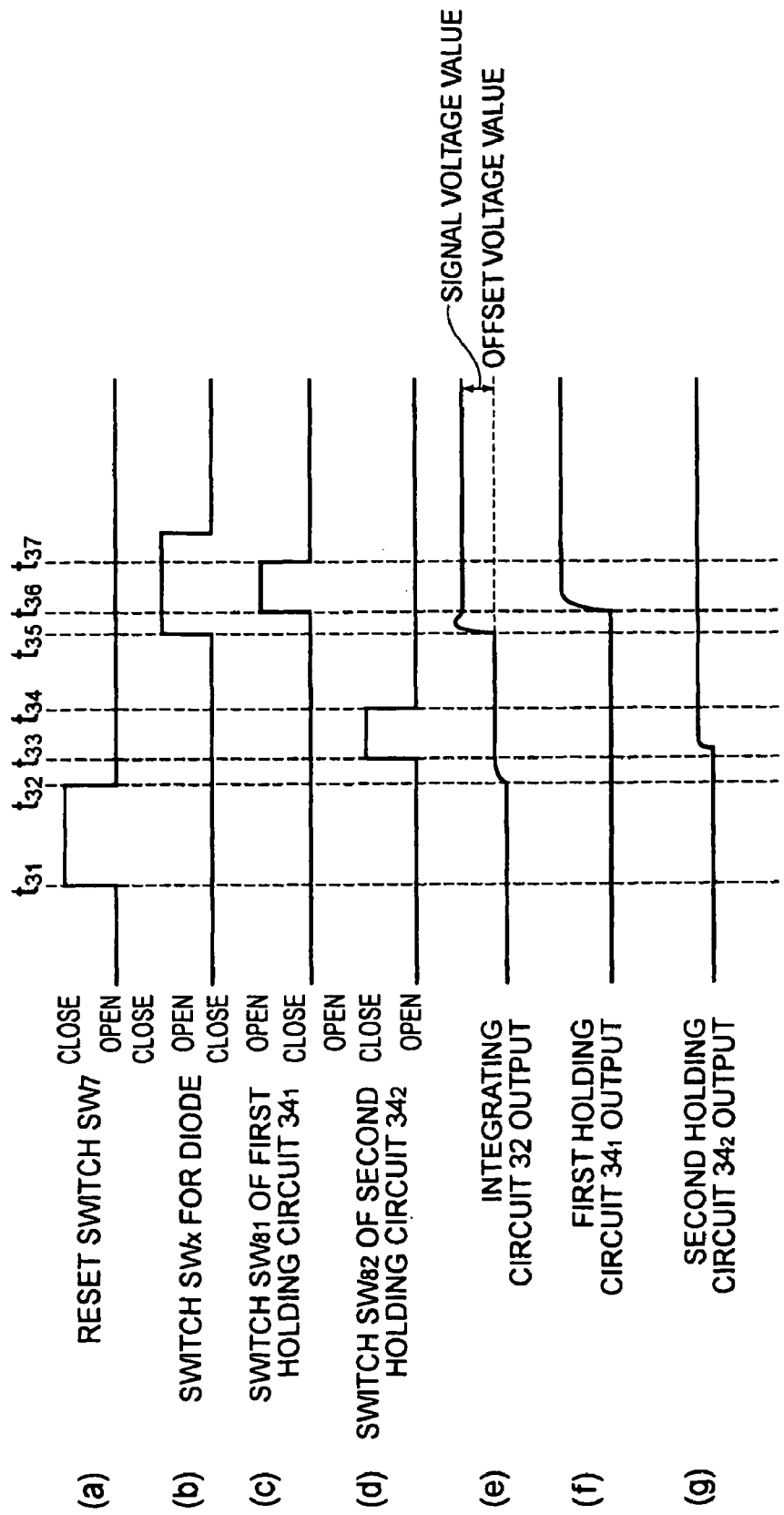

US 8,017,901 B2

PHOTODETECTOR

TECHNICAL FIELD

The present invention relates to a photodetecting device that outputs a voltage value according to the intensity of incident light.

BACKGROUND ART

There is a type of photodetecting device which includes a photodiode that generates electric charge of an amount according to the intensity of incident light, an integrating circuit that accumulates an electric charge generated by the photodiode and outputs a voltage value according to the amount of the accumulated electric charge, and a CDS (Correlated Double Sampling) circuit for removing an offset error and a switching noise (hereinafter, both are collectively referred to as "an offset error etc.") from the voltage value of the integrating circuit.

A configuration of a general photodetecting device including a CDS circuit is shown in FIG. 9. The photodetecting device 3 shown in this figure includes a photodiode $PD_x$, a switch $SW_x$ for the photodiode, an integrating circuit 32, and a CDS circuit 33. The CDS circuit 33 includes a first voltage holding circuit $34_1$, a second voltage holding circuit $34_2$, and a differential conversion circuit 35. The differential conversion circuit 35 is composed of an amplifier and four resistors. In addition, as the differential conversion circuit, for example, one described in Non-Patent Document 1 can also be used.

An operation of the photodetecting device 3 shown in FIG. 9 will be explained. The operation to be explained in the following is performed under control of an unillustrated controlling section. FIG. 10 is a timing chart for explaining operation of the photodetecting device 3. In this figure, shown is (a) opening and closing of a reset switch $SW_7$ included in the integrating circuit 32, (b) opening and closing of the switch $SW_x$ for photodiode provided along with the photodiode $PD_x$, (c) opening and closing of a switch $SW_{81}$ included in the first holding circuit $34_1$, (d) opening and closing of the switch $SW_{82}$ included in the second holding circuit $34_2$, (e) an output voltage value from the integrating circuit 32, (f) an output voltage value from the first holding circuit $34_1$, and (g) an output voltage value from the second holding circuit $34_2$.

The respective times shown in FIG. 10 have an anteroposterior relationship of "$t_{31} < t_{32} < t_{33} < t_{34} < t_{35} < t_{36} < t_{37}$." For a period from time $t_{32}$ to $t_{35}$, the integrating circuit 32 is in a charge accumulable state because the reset switch $SW_7$ is open, but an electric charge is never input from the photodiode $PD_x$ because the switch $SW_x$ for photodiode is open, and no electric charge is accumulated in a capacitor $C_f$ of the integrating circuit 32. However, the output voltage value from the integrating circuit 32 monotonously changes after time $t_{32}$ where the reset switch $SW_7$ is turned from a closed state to an open state, and before long reaches an almost constant voltage value (that is, an offset voltage value) due to an offset error etc., at a certain time before time $t_{33}$.

In the second holding circuit $34_2$, when the switch $SW_{82}$ closed at time $t_{33}$ is opened at time $t_{34}$, a voltage value according to the output voltage value of the integrating circuit 32 at time $t_{34}$ is held by the second holding circuit $34_2$, and after time $t_{34}$, the held voltage value is output from the second holding circuit $34_2$. The voltage value to be output indicates an offset voltage value that is output from the integrating circuit 32.

When the switch $SW_x$ for photodiode is closed for a certain period from time $t_{35}$, an electric charge that has been generated by the photodiode $PD_x$ and accumulated in a junction capacitance section of the photodiode $PD_x$ is input to the integrating circuit 32 through the switch $SW_x$ for photodiode, and accumulated in the capacitor $C_f$ of the integrating circuit 32. Therefore, the voltage value that is output from the integrating circuit 32 results in a superimposed value of a signal voltage value according to the amount of electric charge accumulated in the capacitor $C_f$ and the offset voltage value.

In the first holding circuit $34_1$, when the switch $SW_{81}$ closed at time $t_{36}$ is opened at time $t_{37}$, a voltage value according to the output voltage value of the integrating circuit 32 at time $t_{37}$ is held by the first holding circuit $34_1$, and after time $t_{37}$, the held voltage value is output from the first holding circuit $34_1$. This voltage value indicates a signal voltage value superimposed with the offset voltage value that is output from the integrating circuit 32.

The voltage values output from the first holding circuit $34_1$ and the second holding circuit $34_2$ are input to the differential conversion circuit 35. In the differential conversion circuit 35, a voltage value according to a difference in these two voltage values is output as a differential signal. The voltage value to be output is to indicate a signal voltage value from which an offset error etc., has been removed. Non-Patent Document 1: TEXAS INSTRUMENTS Corp., ADS8482 data sheet, FIG. 8

DISCLOSURE OF THE INVENTION

Problem to be Solved by the Invention

In the above-described photodetecting device 3, since the differential conversion circuit 35 includes four resistors, a problem that thermal noise increases occurs. With an increase in thermal noise, the S/N ratio of the signal voltage value decreases. Although the thermal noise is suppressed if the resistance value of the resistors is reduced, it is necessary in that case to increase driving capability of the amplifier included in the differential conversion circuit 35. Power consumption of the amplifier is increased when the driving capability of the amplifier is increased, and as a result, a problem of an increase in the power consumption of the photodetecting device 3 occurs.

The present invention has been made in order to solve the above problems, and an object thereof is to provide a photodetecting device capable of suppressing an increase in power consumption and generation of thermal noise.

Means for Solving the Problem

A photodetecting device according to the present invention includes (1) a photodiode for generating electric charge of an amount according to an intensity of incident light, (2) a switch for photodiode whose one end is connected to the photodiode, (3) an integrating circuit connected with the other end of the switch for photodiode, for accumulating an electric charge generated by the photodiode and input through the switch for photodiode and outputting a voltage value according to an amount of the accumulated electric charge, and (4) a noise removing circuit including an amplifier having first and second input terminals and first and second output terminals, first, second, third, and fourth switches, and first, second, third, and fourth capacitors, wherein one end of each of the first and second switches is connected to an output terminal of the integrating circuit, the other end of the first switch is connected to one end of the first capacitor, the other end of the second switch is connected to one end of the second capacitor, the other end of the first capacitor is connected to the first input terminal of the amplifier, the other end of the second capacitor is connected to the second input terminal of the amplifier, the third switch and the third capacitor are provided in parallel between the first input terminal of the amplifier and the first output terminal of the amplifier, and the fourth switch and the fourth capacitor are provided in parallel between the second input terminal of the amplifier and the second output terminal of the amplifier, said noise removing circuit for outputting a signal value according to a difference between a voltage value that is output from the integrating circuit at a predetermined time and a voltage value that is output from the integrating circuit after the predetermined time by switching open and closed states of the first to fourth switches.

In this photodetecting device, when the switch for photodiode provided along with the photodiode is closed, an electric charge generated by the photodiode is input to the integrating circuit through the switch for photodiode and accumulated, and a voltage value according to the amount of the accumulated electric charge is output from the integrating circuit. Before the switch for photodiode provided along with the photodiode is closed, an offset voltage value due to an offset error etc., is output from the integrating circuit. The offset voltage value is input to the noise removing circuit at a predetermined time, and after the predetermined time, a superimposed value of a signal voltage value and the offset voltage value is input to the noise removing circuit. Then, the noise removing circuit functions as a CDS circuit to remove the offset voltage value from the signal voltage value and the offset voltage value that have been superimposed, and output a signal voltage value obtained by this removal from the first and second output terminals of the amplifier as a differential signal. Accordingly, output of this photodetecting device results in a value excellent in S/N ratio. The noise removing circuit requires no resistors. Therefore, generation of thermal noise can be reliably suppressed. Moreover, since no resistors are required, it is not necessary to increase driving capability of the amplifier. Consequently, an increase in the power consumption can be suppressed.

Moreover, it is preferable in the photodetecting device according to the present invention that the noise removing circuit further includes a voltage source and a voltage applying switch whose one end is connected to the voltage source and whose other end is connected to the other end of the second switch. This allows expanding the output range of the amplifier included in the noise removing circuit.

Moreover, it is preferable that the photodetecting device according to the present invention further includes an A/D converting circuit for A/D converting a differential voltage value output from the first and second output terminals of the amplifier included in the noise removing circuit. This allows converting a differential voltage value output from the first and second output terminals of the amplifier included in the noise removing circuit to a digital value and outputting the digital value.

Moreover, it is preferable that the photodetecting device according to the present invention further includes a controlling section for controlling operation of each of the switch for the photodiode, the integrating circuit, the noise removing circuit, and the A/D converting circuit. For example, one set of the integrating circuit and the noise removing circuit is provided for a plurality of sets of the photodiodes and switches for the photodiodes, controlling by the controlling section allows the plurality of photodiodes to connect in sequence to the integrating circuit and a signal value from which an offset error etc., has been removed to be output in sequence from the noise removing circuit. As a result, it becomes possible to arrange the plurality of photodiodes one-dimensionally or two-dimensionally so as to image a one-dimensional image or a two-dimensional image, and it also becomes possible to reduce the overall circuit scale.

A photodetecting device according to the present invention includes: a photodiode for generating electric charge of an amount according to an intensity of incident light; a switch for the photodiode whose one end is connected to the photodiode; an integrating circuit connected with the other end of the switch for the photodiode, for accumulating an electric charge generated by the photodiode and input through the switch for the photodiode and outputting a voltage value according to an amount of the accumulated electric charge; a first noise removing circuit for outputting a signal value according to a difference between a voltage value that is output from the integrating circuit at a predetermined time and a voltage value that is output from the integrating circuit after the predetermined time; and a second noise removing circuit including an amplifier having first and second input terminals and first and second output terminals, first, second, third, and fourth switches, and first, second, third, and fourth capacitors, wherein one end of each of the first and second switches is connected to an output terminal of the first noise removing circuit, the other end of the first switch is connected to one end of the first capacitor, the other end of the second switch is connected to one end of the second capacitor, the other end of the first capacitor is connected to the first input terminal of the amplifier, the other end of the second capacitor is connected to the second input terminal of the amplifier, the third switch and the third capacitor are provided in parallel between the first input terminal of the amplifier and the first output terminal of the amplifier, and the fourth switch and the fourth capacitor are provided in parallel between the second input terminal of the amplifier and the second output terminal of the amplifier, said second noise removing circuit for outputting a signal value according to a difference between a voltage value that is output from the first noise removing circuit at the predetermined time and a voltage value that is output from the first noise removing circuit after the predetermined time by switching open and closed states of the first to fourth switches.

In this photodetecting device, when the switch for the photodiode provided along with the photodiode is closed, an electric charge generated by the photodiode is input to the integrating circuit through the switch for the photodiode and accumulated, and a voltage value according to the amount of the accumulated electric charge is output from the integrating circuit. Before the switch for the photodiode provided along with the photodiode is closed, an offset voltage value due to an offset error etc., is output from the integrating circuit. The offset voltage value is input to the first noise removing circuit at a predetermined time, and after the predetermined time, a superimposed value of a signal voltage value and the offset voltage value is input to the first noise removing circuit. Then, the first noise removing circuit functions as a CDS circuit to remove the offset voltage value from the signal voltage value and the offset voltage value that have been superimposed, and output a post-removal voltage value. The second noise removing circuit connected to the first noise removing circuit also functions as a CDS circuit to, if the offset voltage value remains in the output voltage value of the first noise removing circuit, remove the remaining offset voltage value from the output voltage value, and output a post-removal signal voltage value from the first and second output terminals of the amplifier as a differential signal. Accordingly, output of this photodetecting device results in a value excellent in S/N ratio. The first and second noise removing circuits require no resistors. Therefore, generation of thermal noise can be reliably suppressed. Moreover, since no resistors are required, it is not necessary to increase driving capability of the amplifier. Consequently, an increase in the power consumption can be suppressed.

Moreover, it is preferable in the photodetecting device according to the present invention that the second noise removing circuit further includes a voltage source and a voltage applying switch whose one end is connected to the voltage source and whose other end is connected to the other end of the second switch. This allows expanding the output range of the amplifier included in the second noise removing circuit.

Moreover, it is preferable that the photodetecting device according to the present invention further includes an A/D converting circuit for A/D converting and outputting a differential voltage value output from the first and second output terminal of the amplifier included in the second noise removing circuit. This allows converting a differential voltage value output from the first and second output terminals of the amplifier included in the second noise removing circuit to a digital value and outputting the digital value.

Moreover, it is preferable that the photodetecting device according to the present invention further includes a controlling section for controlling operation of each of the switch for the photodiode, the integrating circuit, the first noise removing circuit, the second noise removing circuit, and the A/D converting circuit. In this case, it becomes possible to arrange a plurality of photodiodes one-dimensionally or two-dimensionally and image a one-dimensional image or a two-dimensional image, and it also becomes possible to reduce the overall circuit scale.

Effects of the Invention

According to the present invention, an increase in power consumption and generation of thermal noise can be suppressed.

BRIEF DESCRIPTION OF THE DRAWINGS

FIG. 10 is a timing chart for explaining operation of a general photodetecting device 3 including a CDS circuit.

Figure 1:
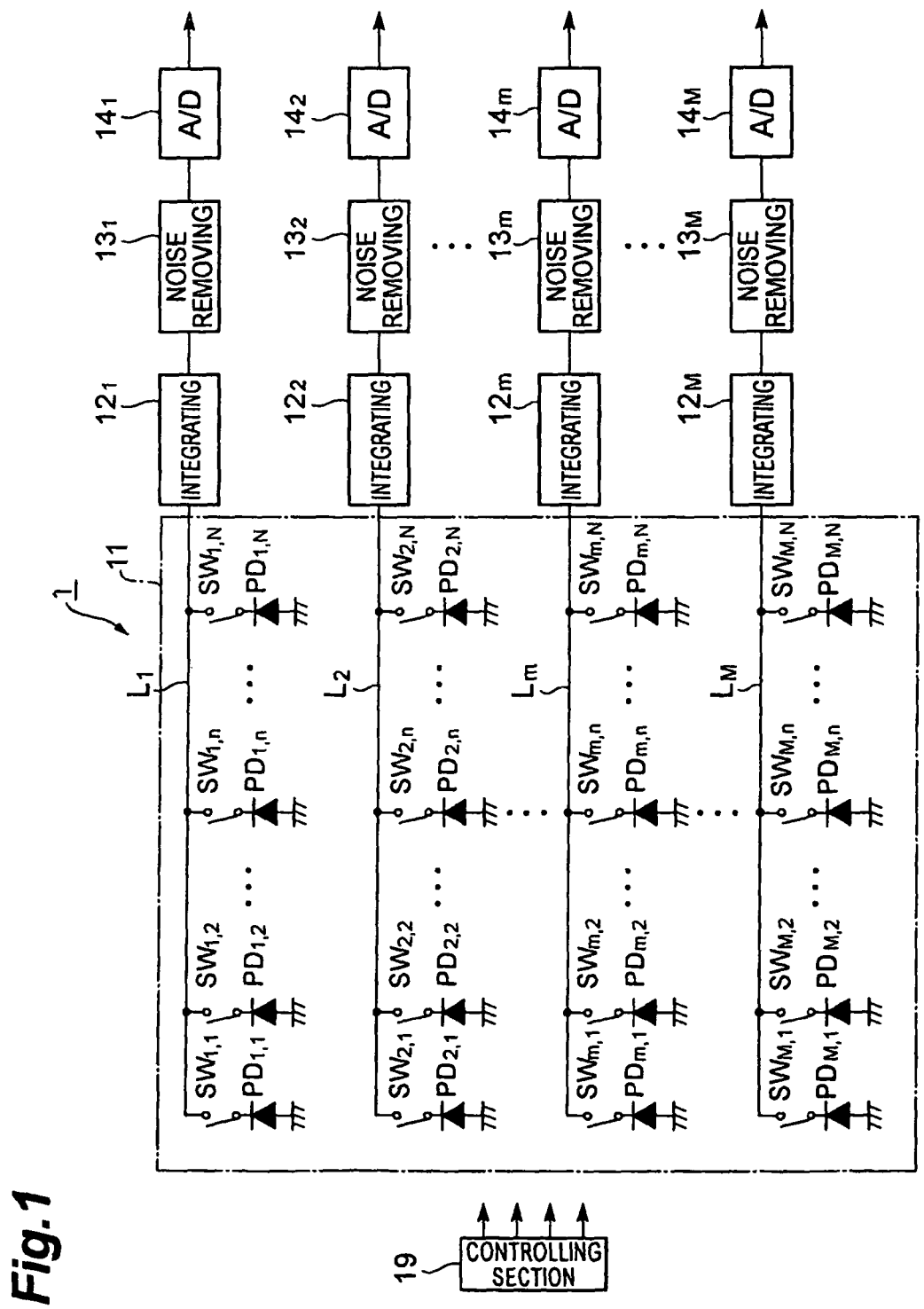
FIG. 1 is a configuration diagram of a photodetecting device 1 according to a first embodiment.

DESCRIPTION OF REFERENCE NUMERALS AND SYMBOLS 1, 2 Photodetecting device
11 Photodetecting section
12, 22 Integrating circuit
13 Noise removing circuit
14, 24 A/D converting circuit
19, 29 Controlling section
23 Second noise removing circuit
25 First noise removing circuit
$A_2, A_3, A_5$ Amplifier
$C_{31}$ to $C_{34}$ Capacitor
SW, $SW_{1,1}$ to $SW_{M,N}$ Switch for photodiode
$SW_2$ Reset switch
$SW_{31}$ to $SW_{35}$ Switch
$V_3$ Power supply
PD Photodiode

BEST MODES FOR CARRYING OUT THE INVENTION

Hereinafter, a best mode for carrying out the present invention will be described in detail with reference to the accompanying drawings. Here, in the description of the drawings, identical elements are denoted by identical reference numerals and symbols so as to avoid overlapping descriptions.

First Embodiment

First, a first embodiment of the photodetecting device according to the present invention will be explained. FIG. 1 is a configuration diagram of a photodetecting device 1 according to the first embodiment. The photodetecting device 1 shown in this figure is capable of imaging a two-dimensional image, and includes a photodetecting section (imaging region) 11, M integrating circuits $12_1$ to $12_M$, M noise removing circuits $13_1$ to $13_M$, M A/D converting circuits $14_1$ to $14_M$, and a controlling section 19. Here, M is an integer equal to or more than 2. Moreover, in the following, N is an integer equal to or more than 2, m is an arbitrary integer equal to or more than 1 and equal to or less than M, and n is an arbitrary integer equal to or more than 1 and equal to or less than N. The M integrating circuits $12_1$ to $12_M$ have a common configuration. The M noise removing circuits $13_1$ to $13_M$ have a common configuration. Moreover, the M A/D converting circuits $14_1$ to $14_M$ have a common configuration.

The photodetecting section 11 includes M×N photodiodes $PD_{1,1}$ to $PD_{M,N}$ and M×N switches $SW_{1,1}$ to $SW_{M,N}$ for the photodiodes, and in sets of photodiodes $PD_{m,n}$ and switches $SW_{m,n}$ for the photodiodes, these are arranged two-dimensionally in M rows and N columns. Each photodiode $PD_{m,n}$ generates electric charge of an amount according to the intensity of incident light, and is located on the m-th row and n-th column. To each photodiode $PD_{m,n}$, one end of the switch $SW_{m,n}$ for the photodiode is connected, and the other end of the switch $SW_{m,n}$ for the photodiode is connected to a wiring $L_m$.

Each integrating circuit $12_m$ is connected with the other end of the switch $SW_{m,n}$ for the photodiode via the wiring $L_m$, accumulates an electric charge input through the switch $SW_{m,n}$ for the photodiode and the wiring $L_m$, and outputs a voltage value according to the amount of the accumulated electric charge to a noise removing circuit $13_m$. Each noise removing circuit $13_m$ outputs, to an A/D converting circuit $14_m$, a voltage value according to a difference between a voltage value that is output at a predetermined time from the integrating circuit $12_m$ and a voltage value that is output from the integrating circuit $12_m$ after the predetermined time.

Each A/D converting circuit $14_m$ is input with a differential voltage value that is output from a negative-side differential output terminal (first output terminal) and a positive-side differential output terminal (second output terminal) of an amplifier $A_3$ included in the noise removing circuit $13_m$, converts the differential voltage value (analog value) to a digital value, and outputs the digital value. The controlling section 19 controls operation of each of the M×N switches $SW_{1,1}$ to $SW_{M,N}$ for photodiodes, the M integrating circuits $12_1$ to $12_M$, the M noise removing circuits $13_1$ to $13_M$, and the M A/D converting circuits $14_1$ to $14_M$ included in the photodetecting section 11.

Figure 2:
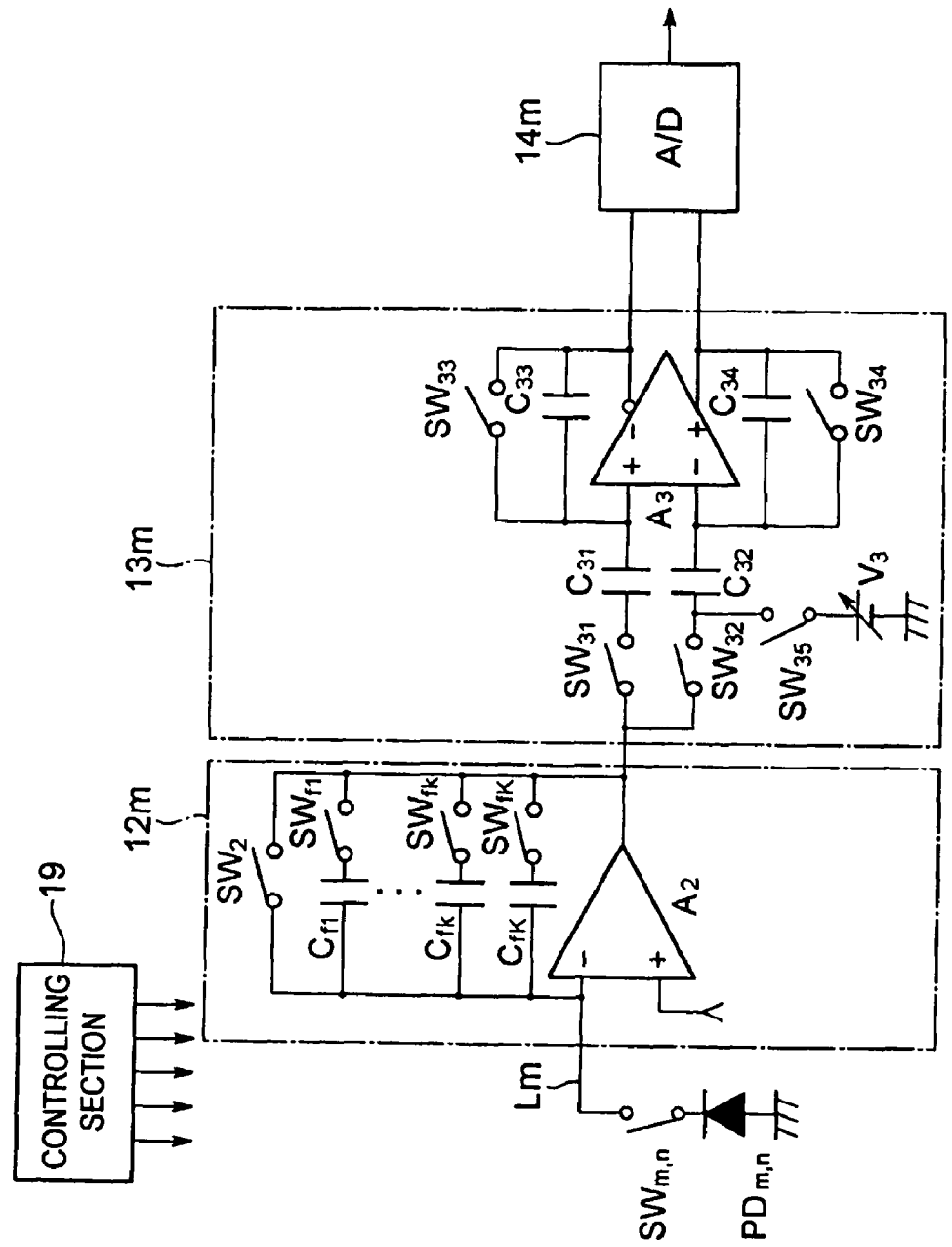
FIG. 2 is a circuit diagram of a photodiode $PD_{m,n}$, a switch $SW_{m,n}$ for photodiode, an integrating circuit $12_m$, and a noise removing circuit $13_m$ included in the photodetecting device 1 according to the first embodiment.

FIG. 2 is a circuit diagram of a photodiode $PD_{m,n}$, a switch $SW_{m,n}$ for photodiode, an integrating circuit $12_m$, a noise removing circuit $13_m$, and an A/D converting circuit $14_m$ included in the photodetecting device 1 according to the first embodiment. Also, in this figure, out of the M×N photodiodes $PD_{1,1}$ to $PD_{M,N}$ and the M×N switches $SW_{1,1}$ to $SW_{M,N}$ for photodiodes included in the photodetecting section 11, the photodiode $PD_{m,n}$ and the switch $SW_{m,n}$ for photodiode located on the m-th row and n-th column are shown as representative.

Each integrating circuit $12_m$ includes an amplifier $A_2$, a reset switch $SW_2$, K capacitors $C_{f1}$ to $C_{fK}$, and K switches $SW_{f1}$ to $SW_{fK}$. Here, K is an integer equal to or more than 2, and k to be mentioned in the following is an arbitrary integer equal to or more than 1 and equal to or less than K. One end of a capacitor $C_{fk}$ is connected to an inverting input terminal of the amplifier $A_2$, and the other end of the capacitor $C_{fk}$ is connected to an output terminal of the amplifier $A_2$ via a switch $SW_{fk}$. In sets of capacitors $C_{fk}$ and switches $SW_{fk}$, these are connected in parallel between the inverting input terminal and output terminal of the amplifier $A_2$. The reset switch $SW_2$ is provided between the inverting input terminal and output terminal of the amplifier $A_2$ while being connected with each set of the capacitor $C_{fk}$ and the switch $SW_{fk}$. The inverting input terminal of the amplifier $A_2$ is connected with the wiring $L_m$, and a non-inverting input terminal of the amplifier $A_2$ is input with a predetermined voltage value. Which of the switches $SW_{f1}$ to $SW_{fK}$ is closed determines the capacitance value of a feedback capacitance section between the non-inverting input terminal and output terminal of the amplifier $A_2$.

The integrating circuit $12_m$, when the reset switch $SW_2$ is open, accumulates an electric charge generated by the photodiode $PD_{m,n}$ and input through the switch $SW_{m,n}$ for the photodiode and the wiring $L_m$ in the capacitor $C_{fk}$, and outputs a voltage value according to the amount of electric charge accumulated in the capacitor $C_{fk}$. On the other hand, for the integrating circuit $12_m$, as a result of the reset switch $SW_2$ being closed, the capacitor $C_{fk}$ is discharged, and the voltage value is initialized.

Each noise removing circuit $13_m$ includes an amplifier $A_3$, a switch $SW_{31}$ (first switch), a switch $SW_{32}$ (second switch), a switch $SW_{33}$ (third switch), a switch $SW_{34}$ (fourth switch), a switch $SW_{35}$ (voltage applying switch), a capacitor $C_{31}$ (first capacitor), a capacitor $C_{32}$ (second capacitor), a capacitor $C_{33}$ (third capacitor), a capacitor $C_{34}$ (fourth capacitor), and a power supply $V_3$. One end of each of the switches $SW_{31}$ and $SW_{32}$ is connected to the output terminal of the integrating circuit $12_m$. The other end of the switch $SW_{31}$ is connected to one end of the capacitor $C_{31}$, and the other end of the switch $SW_{32}$ is connected to one end of the capacitor $C_{32}$. The other end of the capacitor $C_{31}$ is connected to a positive-side differential input terminal (first input terminal) of the amplifier $A_3$, and the other end of the capacitor $C_{32}$ is connected to a negative-side differential input terminal (second input terminal) of the amplifier $A_3$. The switch $SW_{33}$ and the capacitor $C_{33}$ are provided between the positive-side differential input terminal and a negative-side differential output terminal (first output terminal) of the amplifier $A_3$ while being connected in parallel to each other. The switch $SW_{34}$ and the capacitor $C_{34}$ are provided between the negative-side differential input terminal and a positive-side differential output terminal (second output terminal) of the amplifier $A_3$ while being connected in parallel to each other. The voltage $V_3$ is connected with one end of the switch $SW_{35}$, and the other end of the switch $SW_{35}$ is connected with one end of the capacitor $C_{32}$.

The noise removing circuit $13_m$ takes in a voltage value that is output from the integrating circuit $12_m$ at a predetermined time. And, after the predetermined time, the switch $SW_{33}$ is turned from a closed state to an open state, and further, the switch $SW_{31}$ is turned from an open state to a closed state, whereupon electric charge of an amount according to a fluctuation portion in the voltage value that is output from the integrating circuit $12_m$ is to be input to the positive-side differential input terminal of the amplifier $A_3$. In the first embodiment, a time $(t_{14})$ where the switch $SW_{31}$ is first turned from a closed state to an open state is provided as the predetermined time.

Moreover, the noise removing circuit $13_m$ also takes in a voltage value that is output from the integrating circuit $12_m$, at a time where the switch $SW_{32}$ is turned from a closed state to an open state. Then, the switch $SW_{34}$ is turned from a closed state to an open state, and further, the switch $SW_{35}$ is turned from an open state to a closed state, whereupon a difference between a voltage value of the power supply $V_3$ and the taken-in voltage value is to be input to the negative-side differential input terminal of the amplifier $A_3$.

The amplifier $A_3$ outputs a difference between the input voltage value of the positive-side differential input terminal and the input voltage value of the negative-side differential input terminal from the negative-side differential output terminal and the positive-side differential output terminal as a differential signal that symmetrically swings with respect to a center voltage value. For example, in the amplifier $A_3$ having a center voltage value of 2.5V, where the input voltage value of the negative-side differential input terminal is 2.2V and the input voltage value of the positive-side differential input terminal is 3V, the output voltage value from the negative-side differential output terminal is 2.1V, and the output voltage value from the positive-side differential output terminal is 2.9V.

Figure 3:
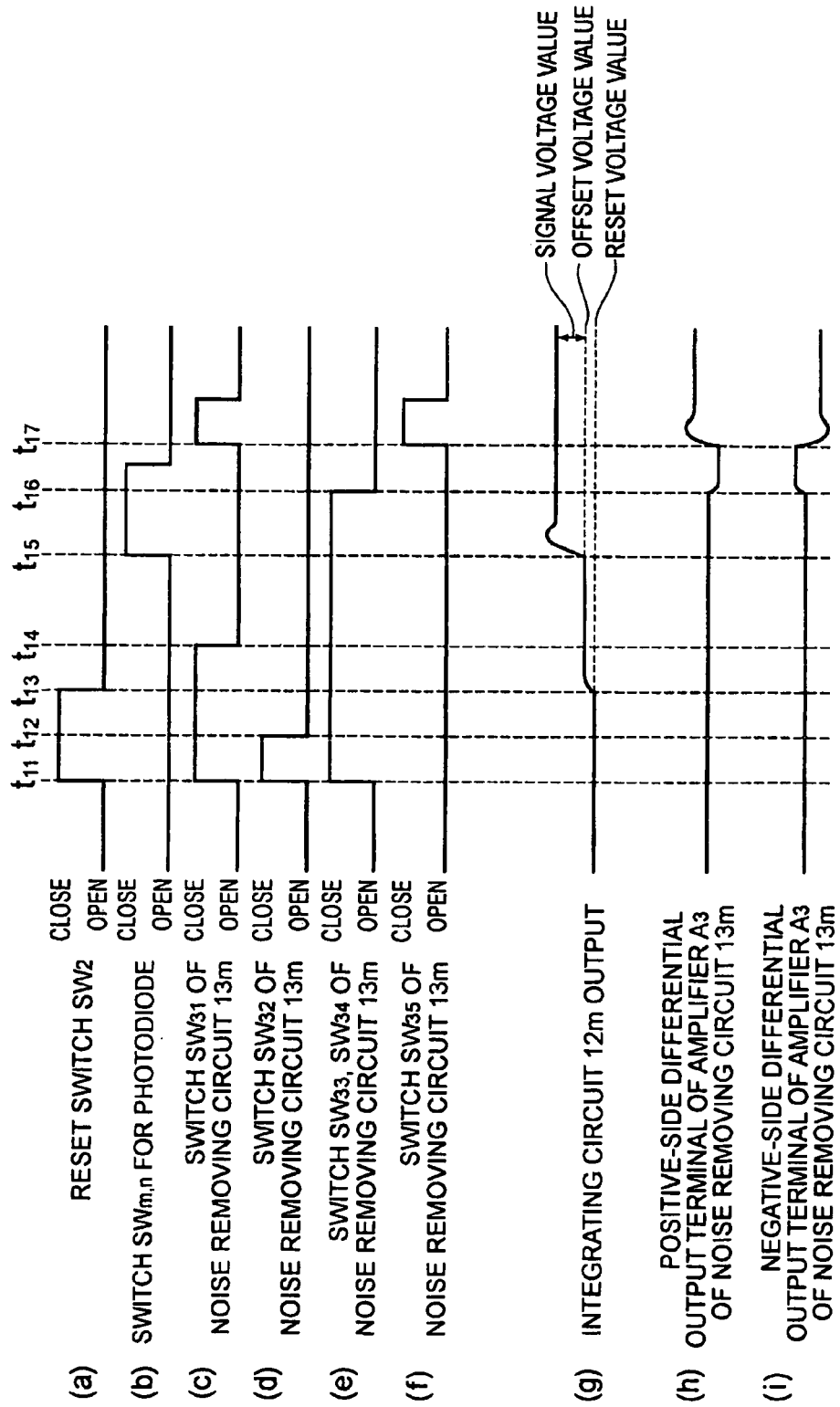
FIG. 3 is a timing chart for explaining operation of the photodetecting device 1 according to the first embodiment.

Next, operation of the photodetecting device 1 according to the first embodiment will be explained. The operation to be explained in the following is performed under control of the controlling section 19. FIG. 3 is a timing chart for explaining operation of the photodetecting device 1 according to the first embodiment. In this figure, shown as operations of the first embodiment is (a) opening and closing of the reset switch $SW_2$ included in the integrating circuit $12_m$, (b) opening and closing of the switch $SW_{m,n}$ for photodiode provided corresponding to the photodiode $PD_{m,n}$, (c) opening and closing of the switch $SW_{31}$ included in the noise removing circuit $13_m$, (d) opening and closing of the switch $SW_{32}$ included in the noise removing circuit $13_m$, (e) opening and closing of the switch $SW_{33}$ and the switch $SW_{34}$ included in the noise removing circuit $13_m$, (f) opening and closing of the switch $SW_{35}$ included in the noise removing circuit $13_m$, (g) an output voltage value from the integrating circuit $12_m$, (h) an output voltage value from the positive-side differential output terminal of the amplifier $A_3$ included in the noise removing circuit $13_m$, and (i) an output voltage value from the negative-side differential output terminal of the amplifier $A_3$ included in the noise removing circuit $13_m$. The respective times have an anteroposterior relationship of "$t_{11} < t_2 < t_{13} < t_{14} < t_{15} < t_{16} < t_{17}$."

In the first embodiment, the photodetecting device 1 operates as shown in FIGS. 3(a) to (i). More specifically, the reset switch $SW_2$ included in the integrating circuit $12_m$ is closed at time $t_{11}$ so that the capacitor $C_{fk}$ is discharged, and the output voltage value from the integrating circuit $12_m$ is initialized. The switch $SW_{33}$ and the switch $SW_{34}$ included in the noise removing circuit $13_m$ are closed at time $t_{11}$ so that the capacitor $C_{33}$ and the capacitor $C_{34}$ are discharged, and the output voltage value from the noise removing circuit $13_m$ is initialized. The switch $SW_{32}$ included in the noise removing circuit $13_m$ is opened at time $t_{12}$, the reset switch $SW_2$ included in the integrating circuit $12_m$ is opened at time $t_{13}$, and the switch $SW_{31}$ included in the noise removing circuit $13_m$ is opened at time $t_{14}$. Then, for a certain period from time $t_{15}$, the switch $SW_{m,n}$ for the photodiode is closed so that an electric charge that has been generated by the photodiode $PD_{m,n}$ and accumulated in a junction capacitance section of the photodiode $PD_{m,n}$ is input to the integrating circuit $12_m$ through the switch $SW_{m,n}$ for the photodiode and the wiring $L_m$. The switch $SW_{33}$ and the switch $SW_{34}$ included in the noise removing circuit $13_m$ are opened at time $t_{16}$, and the switch $SW_{31}$ and the switch $SW_{35}$ included in the noise removing circuit $13_m$ are closed at time $t_{17}$.

The time where the integrating circuit $12_m$ becomes a charge accumulable state is time $t_{13}$ where the reset switch $SW_2$ is opened. For a period from time $t_{13}$ to time $t_{15}$, the integrating circuit $12_m$ is in a charge accumulable state because the reset switch $SW_2$ is open, but an electric charge is never input from the photodiode $PD_{m,n}$ because the switch $SW_{m,n}$ for the photodiode is open, and no electric charge is accumulated in the capacitor $C_{fk}$. However, due to an offset error etc., the output voltage value from the integrating circuit $12_m$ monotonously changes after time $t_{13}$, and before long reaches an almost constant voltage value (that is, an offset voltage value) at a certain time before time $t_{14}$.

In the noise removing circuit $13_m$, the switch $SW_{32}$ is turned from a closed state to an open state at time $t_{12}$. Thereby, electric charge of an amount according to the voltage value output from the integrating circuit $12_m$ at time $t_{12}$ is accumulated in the capacitor $C_{32}$. Since the integrating circuit $12_m$ is in an initialized state at time $t_{12}$, the electric charge to be accumulated in the capacitor $C_{32}$ is of an amount according to the initialized voltage value (hereinafter, referred to as a "reset voltage value") of the integrating circuit $12_m$. Thus, the reset voltage value is taken in the noise removing circuit $13_m$.

In the noise removing circuit $13_m$, when the switch $SW_{31}$ is turned from a closed state to an open state at time $t_{14}$, electric charge of an amount according to the voltage value that is being output from the integrating circuit $12_m$ at that time $t_{14}$ (predetermined time) is accumulated in the capacitor $C_{31}$. Since the integrating circuit $12_m$ is outputting the offset voltage value at time $t_{14}$, the amount of electric charge to be accumulated in the capacitor $C_{31}$ is an amount according to the offset voltage value. Thus, the offset voltage value is taken in the noise removing circuit $13_m$.

For a certain period from time $t_{15}$, the switch $SW_{m,n}$ for the photodiode is closed so that an electric charge that has been generated by the photodiode $PD_{m,n}$ and accumulated in a junction capacitance section of the photodiode $PD_{m,n}$ is input to the integrating circuit $12_m$ through the switch for the photodiode and the wiring $L_m$. The integrating circuit $12_m$ outputs a voltage value for which a signal voltage value according to the amount of electric charge accumulated in the capacitor $C_{fk}$ and the offset voltage value are superimposed.

In the noise removing circuit $13_m$, when the switch $SW_{33}$ is opened at time $t_{16}$ and the switch $SW_{31}$ is closed at time $t_{17}$, a voltage value that is being output from the integrating circuit $12_m$ at that time $t_{17}$ is input to the capacitor $C_{31}$. Then, a difference between the amount of electric charge according to this voltage value and the amount of electric charge already accumulated in the capacitor $C_{31}$ is accumulated in the capacitor $C_{33}$. And, to the positive-side differential input terminal of the amplifier $A_3$, a voltage value according to the amount of electric charge accumulated in the capacitor $C_{33}$ is input. This voltage value results in a difference between the voltage value for which the signal voltage value and the offset voltage value are superimposed and the offset voltage value, that is, the signal voltage value. Thus, the noise removing circuit $13_m$ functions as a CDS circuit.

In the noise removing circuit $13_m$, when the switch $SW_{34}$ is opened at time $t_{16}$ and the switch $SW_{35}$ is closed at time $t_{17}$, a voltage value of the power supply $V_3$ is input to the capacitor $C_{32}$. Then, a difference between the amount of electric charge according to the voltage value of the power supply $V_3$ and the amount of electric charge already accumulated in the capacitor $C_{32}$ is accumulated in the capacitor $C_{34}$. And, to the negative-side differential input terminal of the amplifier $A_3$, a voltage value according to the amount of electric charge accumulated in the capacitor $C_{34}$ is input. This voltage value results in a value according to a difference between the voltage value of the power supply $V_3$ and the reset voltage value.

In the noise removing circuit $13_m$, after time $t_{17}$, a signal of voltage values according to a difference between the input voltage value of the positive-side differential input terminal and the input voltage value of the negative-side differential input terminal of the amplifier $A_3$ is output from the negative-side differential output terminal and the positive-side differential output terminal of the amplifier $A_3$. A center voltage value has been set for the amplifier $A_3$, and the voltage values to be output from the positive-side differential output terminal and the negative-side differential output terminal can be expressed by the following formulas (1) and (2). Here, the output voltage value from the positive-side differential output terminal is provided as $V_{o+}$, the output voltage value from the negative-side differential output terminal is provided as $V_{o-}$, the input voltage value of the positive-side differential input terminal is provided as $V_{i+}$, the input voltage value of the negative-side differential input terminal is provided as $V_{i-}$, and the center voltage value of the amplifier $A_3$ is provided as $V_{com}$.

$$V_{o+} = (V_{i+} - V_{i-}) \div 2 + V_{com} \quad (1)$$

$$V_{o-} = -(V_{i+} - V_{i-}) \div 2 + V_{com} \quad (2)$$

The input voltage value $V_{i+}$ of the positive-side differential input terminal is a signal voltage value. The input voltage value $V_{i-}$ of the negative-side differential input terminal is a value according to a difference between the voltage value of the power supply $V_3$ and the reset voltage value. Accordingly, the output voltage value $V_{o+}$ from the positive-side differential output terminal and the output voltage value $V_{o-}$ from the negative-side differential output terminal expressed by the above formulas (1) and (2) result in values from which an offset error etc., has been removed and are thus excellent in S/N ratio. A voltage value to be output from the noise removing circuit $13_m$ at a certain time after time $t_{17}$ is output to the A/D converting circuit $14_m$, and A/D converted by the A/D converting circuit $14_m$.

When the parallel processing for the M photodiodes $PD_{1,n}$ to $PD_{M,n}$ on the n-th column is completed as in the above, a parallel processing for the M photodiodes $PD_{1,n+1}$ to $PD_{M,n+1}$ on the next column is similarly performed. In this manner, a processing for the M photodiodes to $PD_{1,n}$ to $PD_{M,n}$ on each column is repeatedly performed.

In terms of the m-th row, as a result of the N switches $SW_{m,1}$ to $SW_{m,N}$ for the photodiodes being closed in sequence, the N photodiodes $PD_{m,1}$ to $PD_{m,N}$ are connected in sequence to the integrating circuit $12_m$. Each photodiode $PD_{m,n}$ has a period to be connected to the integrating circuit $12_m$ at a constant frequency, and an electric charge that has been generated in an interval from the last connection period to this connection period and accumulated in a junction capacitance section of the photodiode $PD_{m,n}$ is input to the integrating circuit $12_m$ through the switch $SW_{m,n}$ for the photodiode and the wiring $L_m$.

Accordingly, this photodetecting device 1 allows imaging a one-dimensional image or a two-dimensional image that is excellent in S/N ratio as a result of an offset error etc., having been removed, and allows reducing the overall circuit scale.

Figure 4:
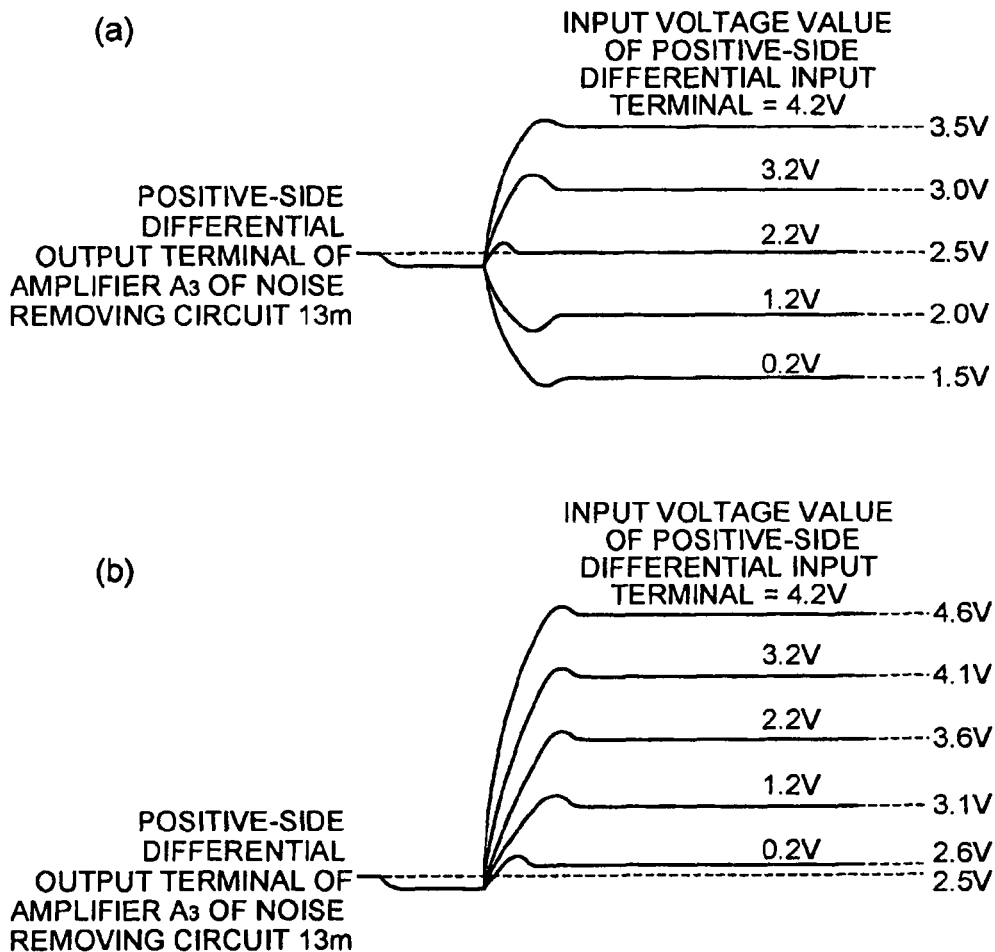
FIG. 4 is a timing chart for explaining operation of the noise removing circuit $13_m$ according to the first embodiment.

In this photodetecting device 1, by providing the power supply $V_3$ and the switch $SW_{35}$ in the noise removing circuit $13_m$, the output voltage value of the noise removing circuit $13_m$ is expanded in range. FIG. 4 is a timing chart for explaining operation of the noise removing circuit $13_m$ according to the first embodiment. In this figure, shown as an operation of the first embodiment is (a) an output voltage value from the positive-side differential output terminal included in the noise removing circuit $13_m$. Moreover, as an operation when the noise removing circuit $13_m$ is not provided with the power supply $V_3$ and the switch $SW_{35}$, shown is (b) an output voltage value from the positive-side differential output terminal of the amplifier $A_3$ included in the noise removing circuit $13_m$.

Where the voltage value $V_3$ of the power supply $V_3$ is provided as 2.2V, the center voltage value $V_{com}$ of the amplifier $A_3$ is provided as 2.5V, and the input voltage value $V_{i+}$ of the positive-side differential input terminal of the amplifier $A_3$ is provided as 0.2V to 4.2V, as shown in FIG. 4(a), the output voltage value $V_{o+}$ from the positive-side differential output terminal becomes 1.5V to 3.5V. This value is calculated from formula (1) mentioned above. Moreover, according to formula (1), when the input voltage value $V_{i+}$ of the positive-side differential input terminal is 0V, the output voltage value $V_{o+}$ from the positive-side differential output terminal is 1.4V. That is, the positive-side differential output terminal of the amplifier $A_3$ is capable of outputting 1.4V or more. In addition, the output range of the negative-side differential output terminal of the amplifier $A_3$ can also be calculated by using the above formula (2). The negative-side differential output terminal is capable of outputting 3.6V or less.

On the other hand, when the power supply $V_3$ and the switch $SW_{35}$ are not included in the noise removing circuit $13_m$, a reset voltage value is to be input to the negative-side differential input terminal of the amplifier $A_3$. Since the reset voltage is almost 0V, output voltage values from the positive-side differential output terminal and the negative-side differential output terminal can be expressed by the following formulas (3) and (4). Here, as in the above formulas (1) and (2), the output voltage value from the positive-side differential output terminal is provided as $V_{o+}$, the output voltage value from the negative-side differential output terminal is provided as $V_{o-}$, the input voltage value of the positive-side differential input terminal is provided as $V_{i+}$, the input voltage value of the negative-side differential input terminal is provided as $V_{i-}$, and the center voltage value of the amplifier $A_3$ is provided as $V_{com}$.

$$V_{o+} = V_{i+} \div 2 + V_{com} \quad (3)$$

$$V_{o-} = -V_{i+} \div 2 + V_{com} \quad (4)$$

In the above formula (3), where the center voltage value $V_{com}$ of the amplifier $A_3$ is provided as 2.5V and the input voltage value $V_{i+}$ of the positive-side differential input terminal of the amplifier $A_3$ is provided as 0.2V to 4.2V, as shown in FIG. 4(b), the output voltage value $V_{o+}$ from the positive-side differential output terminal becomes 2.6V to 4.6V. Moreover, according to formula (3), where the input voltage value $V_{i+}$ of the positive-side differential input terminal is 0V, the output voltage value $V_{o+}$ from the positive-side differential output terminal is 2.5V. That is, the positive-side differential output terminal of the amplifier $A_3$ is incapable of outputting less than 2.5V. In addition, the output range of the negative-side differential output terminal of the amplifier $A_3$ can be calculated by using the above formula (4). The negative-side differential output terminal is incapable of outputting more than 2.5V.

As can be understood by comparison with the operation when the power supply $V_3$ and the switch $SW_{35}$ are not provided in the noise removing circuit $13_m$, in the first embodiment, by providing the power supply $V_3$ and the switch $SW_{35}$ in the noise removing circuit $13_m$, the output range of the positive-side differential output terminal and the negative-side differential output terminal of the amplifier $A_3$ included in the noise removing circuit $13_m$ is expanded.

Figure 5:
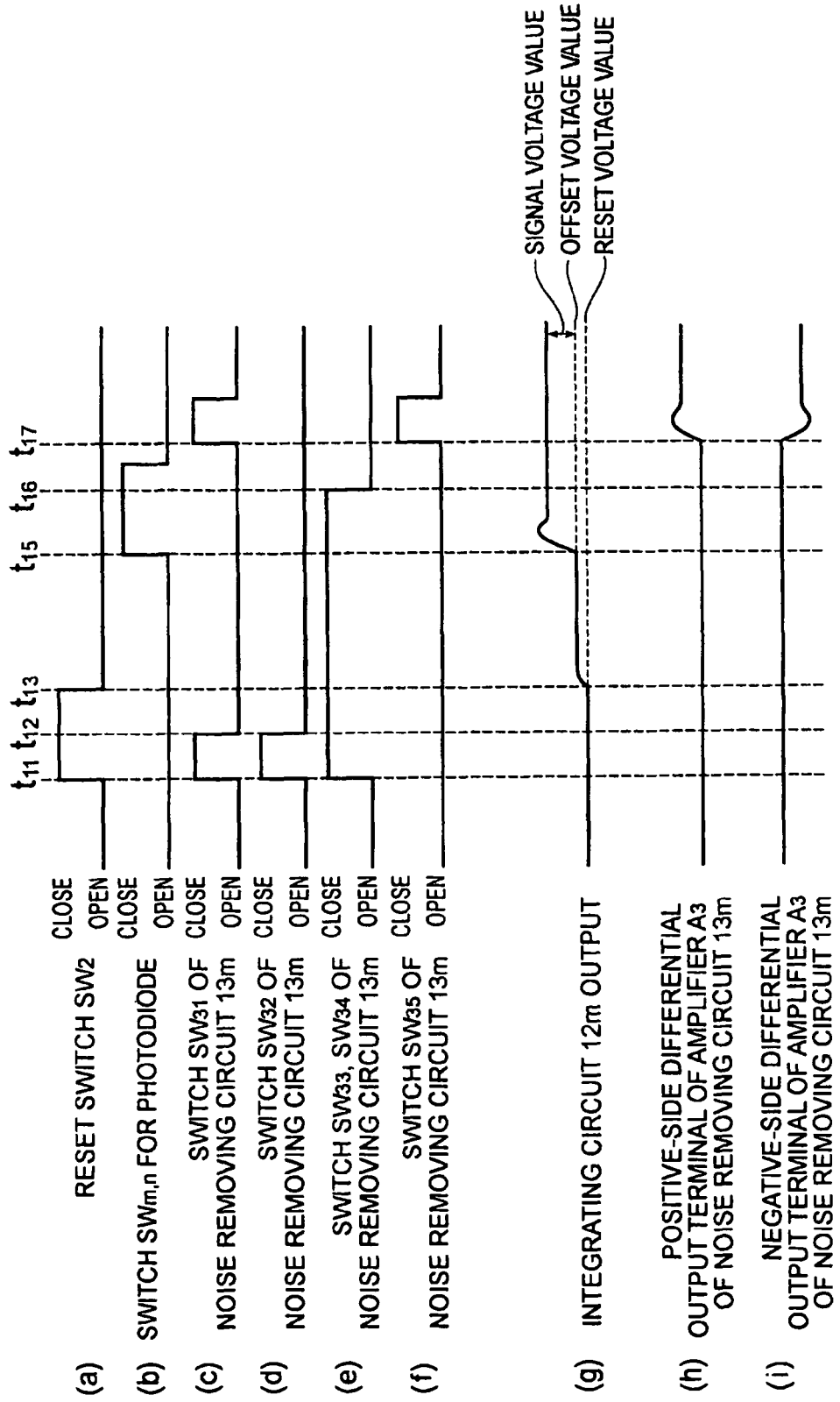
FIG. 5 is a timing chart for explaining operation of the photodetecting device 1 when not making the noise removing circuit $13_m$ function as a CDS circuit.

Moreover, in this photodetecting device 1, the noise removing circuit $13_m$ can be made not to function as a CDS circuit. FIG. 5 is a timing chart for explaining operation of the photodetecting device 1 when not making the noise removing circuit $13_m$ function as a CDS circuit. Times $t_{11}$ to $t_{13}$, $t_{15}$ to $t_{17}$ shown in this figure are identical to the times $t_{11}$ to $t_{13}$, $t_{15}$ to $t_{17}$ shown in FIG. 3. FIGS. 5(a) to (f) are almost identical to FIGS. 3(a) to (f), but are different from FIG. 3 in the point that the switch $SW_{31}$ shown in FIG. 5(c) is opened at time $t_{12}$. When the switch $SW_{31}$ is opened at time $t_{12}$, electric charge of an amount according to the reset voltage value is accumulated in the capacitor $C_{32}$. When the switch $SW_{33}$ is opened at time $t_{16}$ and the switch $SW_{31}$ is closed at time $t_{17}$, a difference between the signal voltage value superimposed with the offset voltage value and the reset voltage value is input to the positive-side differential input terminal of the amplifier $A_3$. In this case, the negative-side differential output terminal and the positive-side differential output terminal of the amplifier $A_3$ are, as shown in FIGS. 5(h) and (i), to output a differential signal according to the signal voltage value superimposed with the offset voltage value. Thus, by changing the timing to close the switch $SW_{31}$, the noise removing circuit $13_m$ can be made so as not to function as a CDS circuit. Therefore, the invention can also respond to a case where removal of the offset voltage value is not required.

Second Embodiment

Figure 6:
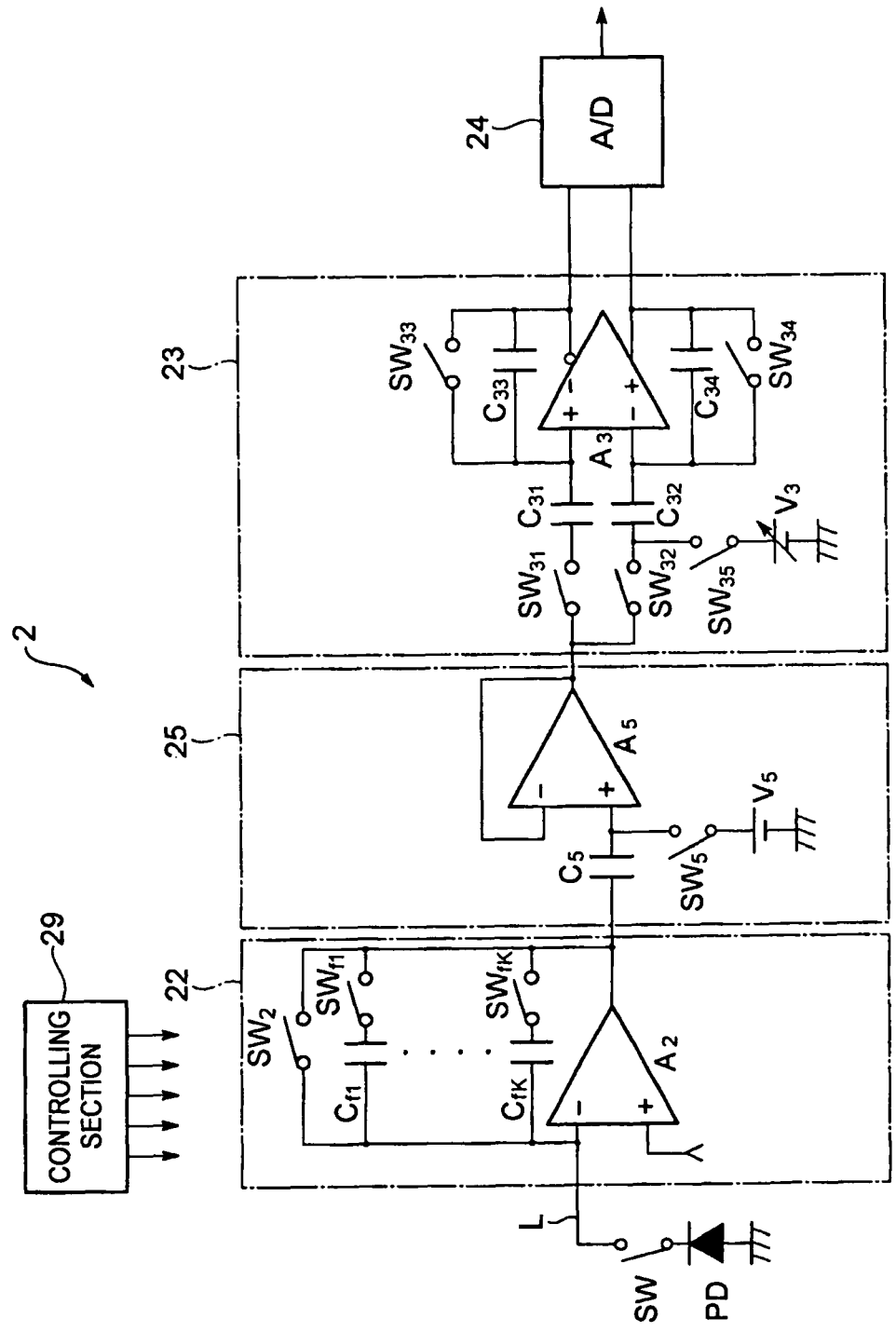
FIG. 6 is a circuit diagram of a photodetecting device 2 according to a second embodiment.

Next, a second embodiment of the photodetecting device according to the present invention will be explained. FIG. 6 is a circuit diagram of a photodetecting device 2 according to a second embodiment. The photodetecting device 2 shown in this figure includes a photodiode PD, a switch SW for the photodiode, an integrating circuit 22, a first noise removing circuit 25, a second noise removing circuit 23, an A/D converting circuit 24, and a controlling section 29. The switch SW for the photodiode and an input terminal of the integrating circuit 22 are connected by a wiring L. The configuration of each of the photodiode PD, switch SW for the photodiode, and integrating circuit 22 is the same as that in the case of the first embodiment.

The first noise removing circuit 25 includes an amplifier $A_5$, a capacitor $C_5$, a switch $SW_5$, and a power supply $V_5$. One end of the capacitor $C_5$ is connected to an output terminal of the integrating circuit 22, and the other end of the capacitor $C_5$ is connected to a non-inverting input terminal of the amplifier $A_5$. An inverting input terminal of the amplifier $A_5$ is connected to an output terminal of the amplifier $A_5$. The power supply $V_5$ is connected to one end of the switch $SW_5$, and the other end of the switch $SW_5$ is connected to the non-inverting input terminal of the amplifier $A_5$.

The first noise removing circuit 25 takes in a voltage value that is output from the integrating circuit 22 at a predetermined time. And, after the predetermined time, electric charge of an amount according to a fluctuation portion in the voltage value that is output from the integrating circuit 22 is input to the non-inverting input terminal of the amplifier $A_5$. In the second embodiment, a time where the switch $SW_5$ is first turned from a closed state to an open state is provided as the predetermined time ($t_{24}$).

The configuration of the second noise removing circuit 23 is almost the same as that of the noise removing circuit $13_m$ in the first embodiment. However, these are different in the point that one end of each of the switches $SW_{31}$ and $SW_{32}$ is connected to the output terminal of the integrating circuit $12_m$ in the noise removing circuit $13_m$, while in the second noise removing circuit 23, one end of each of the switches $SW_{31}$ and $SW_{32}$ is connected to the output terminal of the first noise removing circuit 25.

The controlling section 29 controls operation of each of the switch SW for the photodiode provided along with the photodiode PD, the integrating circuit 22, the first noise removing circuit 25, the second noise removing circuit 23, and the A/D converting circuit 24.

In the second embodiment, the first noise removing circuit 25 outputs the signal voltage value superimposed with the offset voltage value, that is output from the integrating circuit 22, from which the offset voltage value has been removed. In the second noise removing circuit 23, the voltage value, that is output from the first noise removing circuit 25, from which a remaining portion of the offset voltage value has been removed is input to the positive-side differential input terminal of the amplifier $A_3$, and the voltage value of the power supply $V_3$ from which the initialized voltage value of the integrating circuit 22 has been subtracted is input to the negative-side differential input terminal of the amplifier $A_3$. The positive-side differential output terminal and the negative-side differential output terminal of the amplifier $A_3$ output a differential signal according to a difference between the input voltage value of the negative-side differential input terminal and the input voltage value of the positive-side differential input terminal. Moreover, the A/D converting circuit 24 converts a voltage value of the differential signal that is output from the second noise removing circuit 23 to a digital value, and outputs the digital value.

Although one set of the integrating circuit 22, first noise removing circuit 25, second noise removing circuit 23, and A/D converting circuit 24 may be provided for one set of the photodiode PD and switch SW for the photodiode, it is more preferable that one set of the integrating circuit 22, first noise removing circuit 25, second noise removing circuit 23, and A/D converting circuit 24 is provided for a plurality of sets of the photodiodes PD and switches SW for photodiodes as in the case of the first embodiment.

Figure 7:
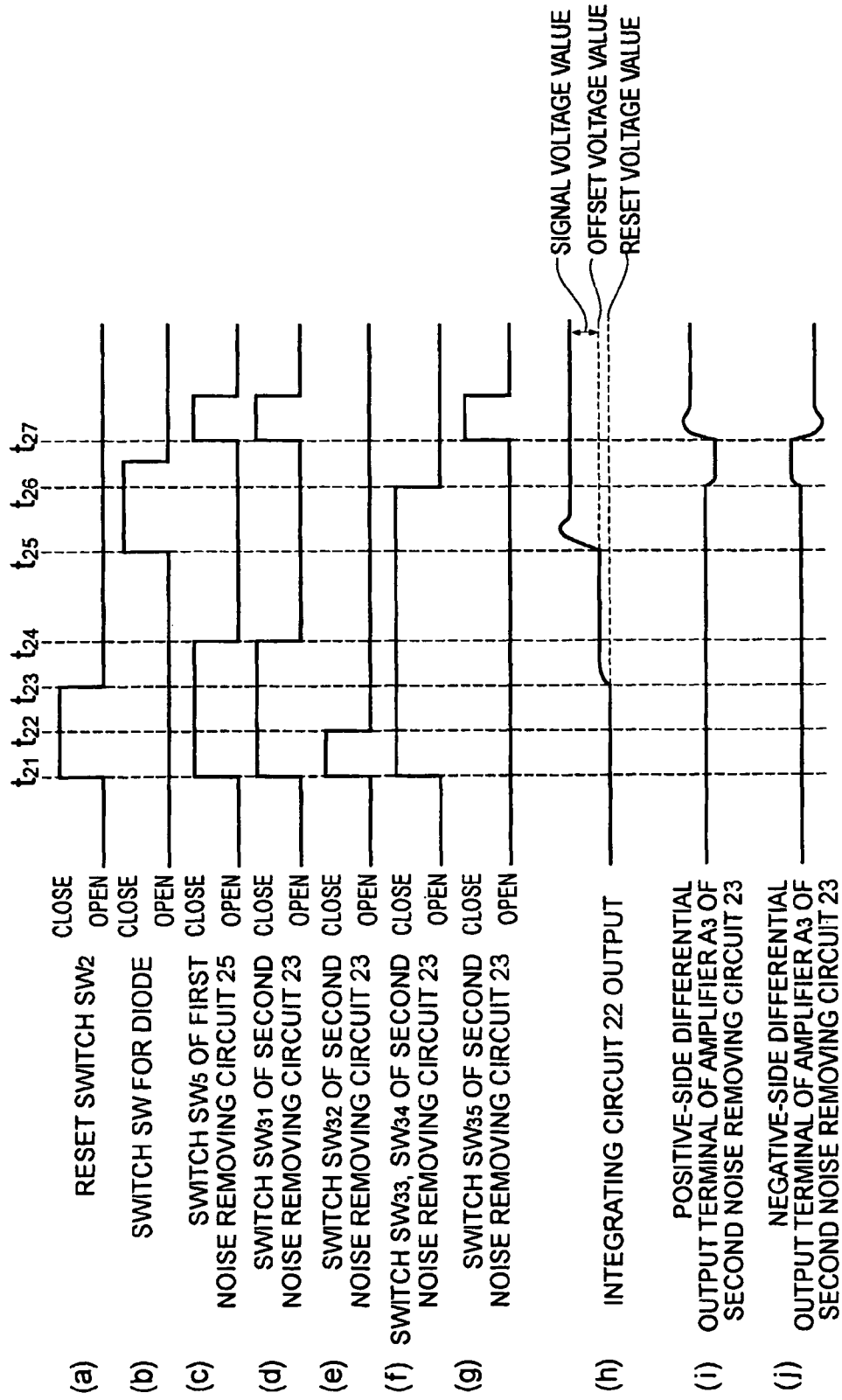
FIG. 7 is a timing chart for explaining operation of the photodetecting device 2 according to the second embodiment.

Next, operation of the photodetecting device 2 according to the second embodiment will be explained. The operation to be explained in the following is performed under control of the controlling section 29. FIG. 7 is a timing chart for explaining operation of the photodetecting device 2 according to the second embodiment. Also, explanation will be given of operation of the photodetecting device 2 on the assumption that the photodiode PD, the switch SW for the photodiode, the integrating circuit 22, the first noise removing circuit 25, the second noise removing circuit 23, and the A/D converting circuit 24 are provided one each.

In this figure, shown is (a) opening and closing of the reset switch $SW_2$ included in the integrating circuit 22, (b) opening and closing of the switch SW for the photodiode provided corresponding to the photodiode PD, (c) opening and closing of the switch $SW_5$ included in the first noise removing circuit 25, (d) opening and closing of the switch $SW_{31}$ included in the second noise removing circuit 23, (e) opening and closing of the switch $SW_{32}$ included in the second noise removing circuit 23, (f) opening and closing of the switch $SW_{33}$ and the switch $SW_{34}$ included in the second noise removing circuit 23, (g) opening and closing of the switch $SW_{35}$ included in the second noise removing circuit 23, (h) an output voltage value from the integrating circuit 22, (i) an output voltage value from the positive-side differential output terminal of the amplifier $A_3$ included in the second noise removing circuit 23, and (j) an output voltage value from the negative-side differential output terminal of the amplifier $A_3$ included in the second noise removing circuit 23. The respective times have an anteroposterior relationship of "$t_{21} < t_{22} < t_{23} < t_{24} < t_{25} < t_{26} < t_{27}$."

In the integrating circuit 22, for a period from time $t_{21}$ to time $t_{23}$, the reset switch $SW_2$ included in the integrating circuit 22 is closed so that the capacitor $C_{fk}$ is discharged, and the output voltage value from the integrating circuit 22 is initialized. In the first noise removing circuit 25, the switch $SW_5$ is closed at time $t_{21}$, opened at time $t_{24}$, and closed at time $t_{27}$. In the second noise removing circuit 23, the switches $SW_{31}$ to $SW_{34}$ are closed at time $t_{21}$, the switch $SW_{32}$ is opened at time $t_{22}$, the switch $SW_{31}$ is opened at time $t_{24}$, the switch $SW_{33}$ and the switch $SW_{34}$ are opened at time $t_{26}$, and the switch $SW_{31}$ and the switch $SW_{35}$ are closed at time $t_{27}$. Moreover, for a certain period from time $t_{25}$, the switch SW for the photodiode is closed so that an electric charge that has been generated by the photodiode PD and accumulated in a junction capacitance section of the photodiode PD is input to the integrating circuit 22 through the switch SW for the photodiode and the wiring L.

The time where the integrating circuit 22 becomes a charge accumulable state is time $t_{23}$ where the reset switch $SW_2$ is opened. The time where the first noise removing circuit 25 takes in the voltage value output from the integrating circuit 22 is time $t_{24}$ where the switch $SW_5$ is first turned from a closed state to an open state. Moreover, the time where the second noise removing circuit 23 takes in the voltage value output from the first noise removing circuit 25 is time $t_{24}$ where the switch $SW_{31}$ is first turned from a closed state to an open state.

For a period from time $t_{23}$ to time $t_{25}$, the integrating circuit 22 is in a charge accumulable state because the reset switch $SW_2$ is open, but an electric charge is never input from the photodiode PD because the switch SW for the photodiode is open, and no electric charge is accumulated in the capacitor $C_{fk}$. However, due to an offset error etc., the output voltage value from the integrating circuit 22 monotonously changes after time $t_{23}$, and before long reaches an almost constant voltage value (that is, an offset voltage value) at a certain time before time $t_{24}$. The switch $SW_5$ and the switch $SW_{31}$ are opened at time $t_{24}$ so that the first noise removing circuit 25 and the second noise removing circuit 23 take in the offset voltage value.

In the second noise removing circuit 23, when the switch $SW_{32}$ is opened at time $t_{22}$, a voltage value according to the output voltage value of the integrating circuit 22 at time $t_{22}$ is taken in to the second noise removing circuit 23. The voltage value to be taken in indicates the initialized voltage value (hereinafter, referred to as a "reset voltage value") of the integrating circuit 22. When the switch $SW_{34}$ is opened at time $t_{26}$ and the switch $SW_{35}$ is closed at time $t_{27}$, the voltage value according to a difference between the voltage value of the power supply $V_3$ and the reset voltage value is input to the negative-side differential input terminal of the amplifier $A_3$ of the second noise removing circuit 23.

For a certain period from time $t_{25}$, the switch SW for the photodiode is closed so that an electric charge that has been generated by the photodiode PD and accumulated in a junction capacitance section of the photodiode PD is input to the integrating circuit 22 through the switch SW for the photodiode and the wiring L, and accumulated in the capacitor $C_{fk}$ of the integrating circuit 22. And, the voltage value that is output from the integrating circuit 22 results in a superimposed value of a signal voltage value according to the amount of electric charge accumulated in the capacitor $C_{fk}$ and the offset voltage value.

In the first noise removing circuit 25, when the switch $SW_5$ is closed at time $t_{27}$, a voltage value according to a difference between the voltage value that is output from the integrating circuit 22 and the offset voltage value previously taken in is output from the amplifier $A_5$. Thus, the first noise removing circuit 25 functions as a CDS circuit. In the second noise removing circuit 23, when the switch $SW_{33}$ is opened at time $t_{26}$ and the switch $SW_{31}$ is closed at time $t_{27}$, a voltage value according to a difference between the voltage value that is output from the first noise removing circuit 25 and the offset voltage value previously taken in is input to the positive-side differential input terminal of the amplifier $A_3$. The voltage value to be input to the positive-side differential input terminal of the amplifier $A_3$ results in a superimposed value of the signal voltage value and the offset voltage value from which the offset voltage value has been sufficiently removed, that is, the signal voltage value. Thus, the second noise removing circuit 23 functions as a CDS circuit.

After time $t_{27}$, a differential signal according to a difference between the input voltage value of the positive-side differential input terminal and the input voltage value of the negative-side differential input terminal of the amplifier $A_3$ is output from the negative-side differential output terminal and the positive-side differential output terminal of the amplifier $A_3$. A center voltage value has been set for the amplifier $A_3$, and the voltage values to be output from the negative-side differential output terminal and the positive-side differential output terminal can be expressed, as in the first embodiment, by the above formulas (1) and (2). The input voltage value $V_{i+}$ of the positive-side differential input terminal is a signal voltage value. The input voltage value $V_{i-}$ of the negative-side differential input terminal is a value according to a difference between the voltage value of the power supply $V_3$ and the reset voltage value. Accordingly, the output voltage value $V_{o+}$ from the positive-side differential output terminal and the output voltage value $V_{o-}$ from the negative-side differential output terminal of the amplifier $A_3$ expressed by the above formulas (1) and (2) result in values from which an offset error etc., has been removed and are thus excellent in S/N ratio.

Figure 8:
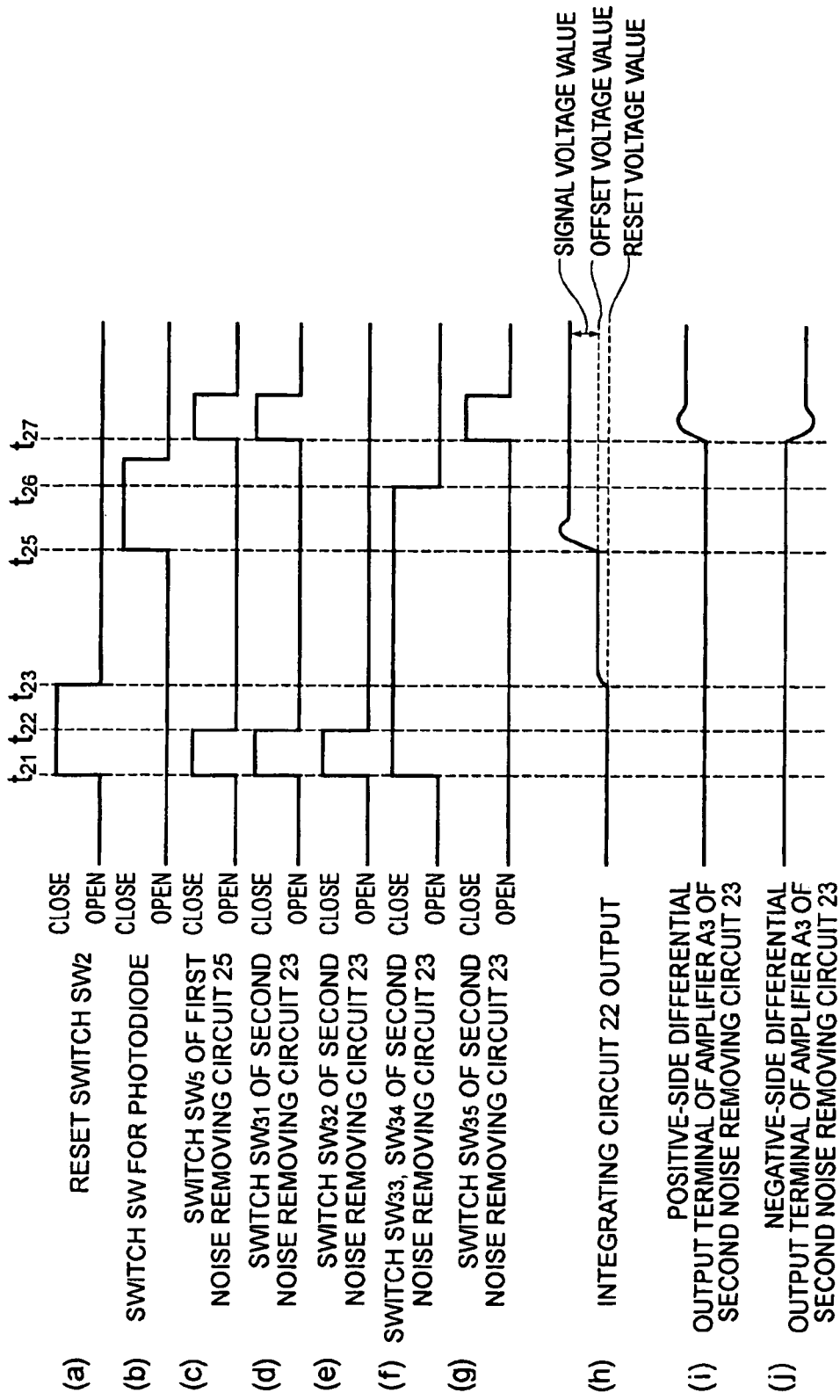
FIG. 8 is a timing chart for explaining operation of the photodetecting device 2 when not making a second noise removing circuit 23 function as a CDS circuit.
Figure 9:
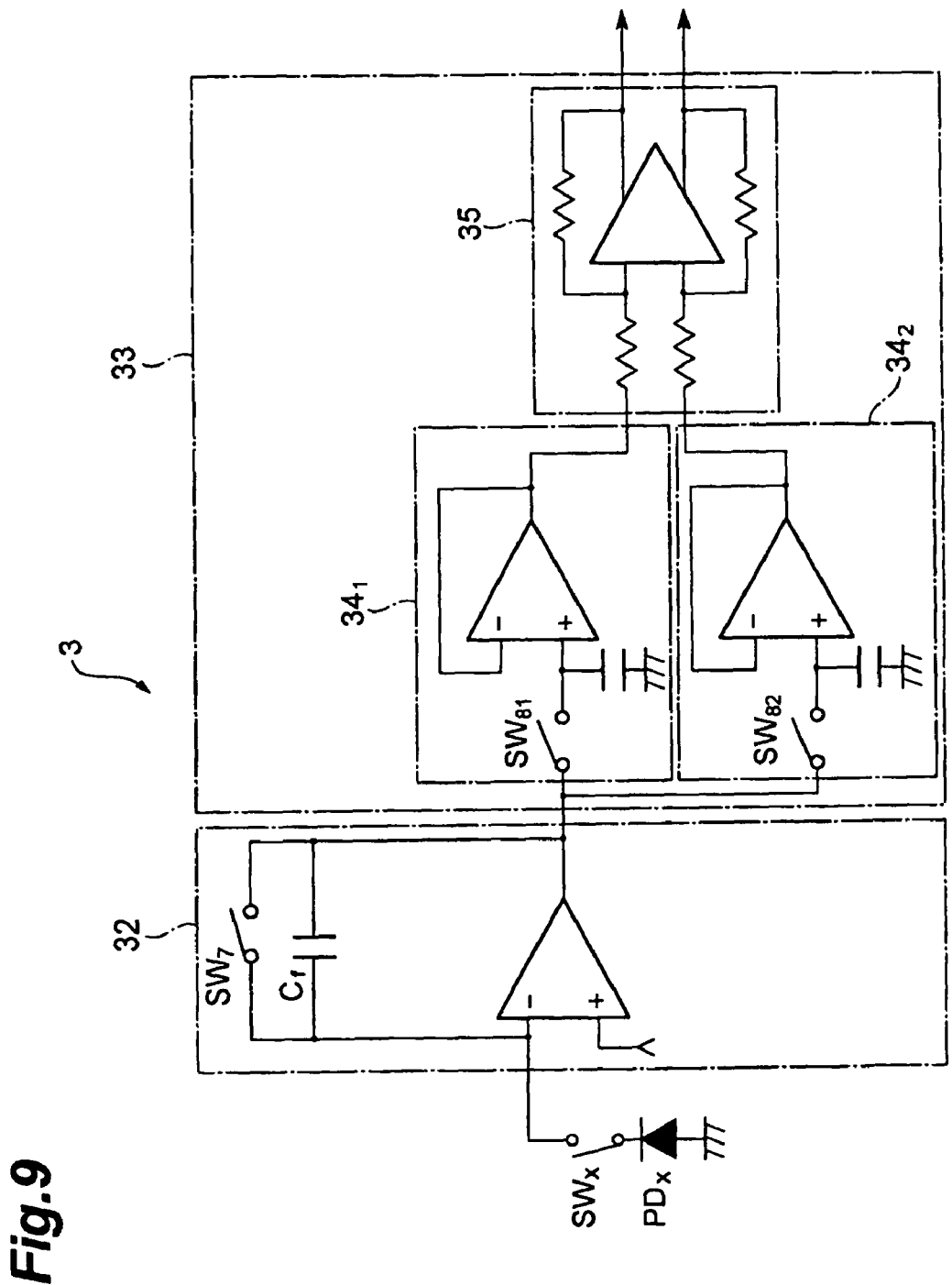
FIG. 9 is a configuration diagram of a general photodetecting device 3 including a noise removing circuit.

Also, in this photodetecting device 2, the first noise removing circuit 25 and the second noise removing circuit 23 can be made not to function as CDS circuits. FIG. 8 is a timing chart for explaining operation of the photodetecting device 2 when not making the first noise removing circuit 25 and the second noise removing circuit 23 function as CDS circuits. Times $t_{21}$ to $t_{22}$, $t_{25}$ to $t_{27}$ shown in this figure are identical to the times $t_{21}$ to $t_{22}$, $t_{25}$ to $t_{27}$ shown in FIG. 7. FIGS. 8(a) to (g) are almost identical to FIGS. 7(a) to (g), but are different from FIG. 7 in the point that the switch $SW_5$ of the first noise removing circuit 25 and the switch $SW_{31}$ of the second noise removing circuit 23 shown in FIG. 8(c) and FIG. 8(d) are opened at time $t_{22}$. When the switch $SW_5$ and the switch $SW_{31}$ are opened at time $t_{22}$, the switch $SW_{33}$ is opened at time $t_{26}$, and the switch $SW_5$ and the switch $SW_{31}$ are closed at time $t_{27}$, a difference between the signal voltage value superimposed with the offset voltage value and the reset voltage value is input to the positive-side differential input terminal of the amplifier $A_3$. In this case, the negative-side differential output terminal and the positive-side differential output terminal of the amplifier $A_3$ are, as shown in FIGS. 8(i) and (j), to output differential signals according to the signal voltage value superimposed with the offset voltage value. Thus, by changing the timing to close the switch $SW_5$ and the switch $SW_{31}$, the first noise removing circuit 25 and the second noise removing circuit 23 can be made so as not to function as CDS circuits. Therefore, the invention can also respond to a case where removal of the offset voltage value is not required.

(Modification)

The present invention is by no means limited to the above-mentioned embodiments and various modifications can be made. For example, the concrete configuration of the first noise removing circuit in the second embodiment is not limited to one explained in the above-mentioned embodiment, and can be variously modified.

INDUSTRIAL APPLICABILITY

The present invention can be applied to a photodetecting device that outputs a voltage value according to the intensity of incident light.

The invention claimed is:

1. A photodetecting device comprising:
a photodiode for generating electric charge of an amount according to an intensity of incident light;
a switch for the photodiode, one end of the switch being connected to the photodiode;
an integrating circuit connected with the other end of the switch for the photodiode, for accumulating an electric charge generated by the photodiode and input through the switch for the photodiode and outputting a voltage value according to an amount of the accumulated electric charge; and
a noise removing circuit including an amplifier having first and second input terminals and first and second output terminals, first, second, third, and fourth switches, and first, second, third, and fourth capacitors, wherein one end of each of the first and second switches is connected to an output terminal of the integrating circuit, the other end of the first switch is connected to one end of the first capacitor, the other end of the second switch is connected to one end of the second capacitor, the other end of the first capacitor is connected to the first input terminal of the amplifier, the other end of the second capacitor is connected to the second input terminal of the amplifier, the third switch and the third capacitor are provided in parallel between the first input terminal of the amplifier and the first output terminal of the amplifier, and the fourth switch and the fourth capacitor are provided in parallel between the second input terminal of the amplifier and the second output terminal of the amplifier, said noise removing circuit for outputting a signal value according a difference between a voltage value that is output from the integrating circuit at a predetermined time and a voltage value that is output from the integrating circuit after the predetermined time by switching open and closed states of the first to fourth switches.

2. The photodetecting device according to claim 1, wherein the noise removing circuit further includes a voltage source and a voltage applying switch whose one end is connected to the voltage source and whose other end is connected to one end of the second capacitor.

3. The photodetecting device according to claim 1 or 2, further including an A/D converting circuit for A/D converting and outputting a differential voltage value output from the first and second output terminals of the amplifier included in the noise removing circuit.

4. The photodetecting device according to claim 3, further including a controlling section for controlling operation of each of the switch for the photodiode, the integrating circuit, the noise removing circuit, and the A/D converting circuit.

5. A photodetecting device comprising:
a photodiode for generating electric charge of an amount according to an intensity of incident light;
a switch for the photodiode whose one end is connected to the photodiode;
an integrating circuit connected with the other end of the switch for the photodiode, for accumulating an electric charge generated by the photodiode and input through the switch for the photodiode and outputting a voltage value according to an amount of the accumulated electric charge;
a first noise removing circuit for outputting a signal value according a difference between a voltage value that is output from the integrating circuit at a predetermined time and a voltage value that is output from the integrating circuit after the predetermined time; and
a second noise removing circuit including an amplifier having first and second input terminals and first and second output terminals, first, second, third, and fourth switches, and first, second, third, and fourth capacitors, wherein one end of each of the first and second switches is connected to an output terminal of the first noise removing circuit, the other end of the first switch is connected to one end of the first capacitor, the other end of the second switch is connected to one end of the second capacitor, the other end of the first capacitor is connected to the first input terminal of the amplifier, the other end of the second capacitor is connected to the second input terminal of the amplifier, the third switch and the third capacitor are provided in parallel between the first input terminal of the amplifier and the first output terminal of the amplifier, and the fourth switch and the fourth capacitor are provided in parallel between the second input terminal of the amplifier and the second output terminal of the amplifier, said second noise removing circuit for outputting a signal value according a difference between a voltage value that is output from the first noise removing circuit at the predetermined time and a voltage value that is output from the first noise removing circuit after the predetermined time by switching open and closed states of the first to fourth switches.

6. The photodetecting device according to claim 5, wherein the second noise removing circuit further includes a voltage source and a voltage applying switch whose one end is connected to the voltage source and whose other end is connected to one end of the second capacitor.

7. The photodetecting device according to claim 5 or 6, further including an A/D converting circuit for A/D converting and outputting a differential voltage value output from the first and second output terminal of the amplifier included in the noise removing circuit.

8. The photodetecting device according to claim 7, further including a controlling section for controlling operation of each of the switch for photodiode, the integrating circuit, the first noise removing circuit, the second noise removing circuit, and the A/D converting circuit.

* * * * *